United States Patent
Keto

(10) Patent No.: US 10,273,579 B2
(45) Date of Patent: Apr. 30, 2019

(54) APPARATUS FOR PROCESSING TWO OR MORE SUBSTRATES IN A BATCH PROCESS

(71) Applicant: BENEQ OY, Espoo (FI)

(72) Inventor: Leif Keto, Kauniainen (FI)

(73) Assignee: Beneq Oy, Espoo (FI)

( * ) Notice: Subject to any disclaimer, the term of this patent is extended or adjusted under 35 U.S.C. 154(b) by 0 days.

(21) Appl. No.: 14/777,613

(22) PCT Filed: Feb. 28, 2014

(86) PCT No.: PCT/FI2014/050151
§ 371 (c)(1),
(2) Date: Sep. 16, 2015

(87) PCT Pub. No.: WO2014/147290
PCT Pub. Date: Sep. 25, 2014

(65) Prior Publication Data
US 2016/0281228 A1    Sep. 29, 2016

(30) Foreign Application Priority Data

Mar. 22, 2013  (FI) .................................... 20135280

(51) Int. Cl.
*H01L 21/673*    (2006.01)
*C23C 16/458*    (2006.01)
(Continued)

(52) U.S. Cl.
CPC .... *C23C 16/4583* (2013.01); *C23C 16/45546* (2013.01); *H01L 21/67313* (2013.01);
(Continued)

(58) Field of Classification Search
CPC .......... C23C 16/4583; C23C 16/45546; H01L 21/67313; H01L 21/67346;
(Continued)

(56) References Cited

U.S. PATENT DOCUMENTS 6,467,491 B1    10/2002  Sugiura
2005/0188923 A1  9/2005  Cook et al.
(Continued)

FOREIGN PATENT DOCUMENTS

JP    03185718 A  *  8/1991
JP    08330397 A  * 12/1996
(Continued)

OTHER PUBLICATIONS

International Search Report issued in Finnish Patent Application No. 20135280 dated Dec. 5, 2013.
(Continued)

*Primary Examiner* — Yuechuan Yu
(74) *Attorney, Agent, or Firm* — Eversheds Sutherland (US) LLP

(57) ABSTRACT

An apparatus for processing two or more substrates in a batch process by subjecting at least part of the surface of the substrates to alternating surface reactions of at least a first and a second precursor. The apparatus includes: multiple substrate holders for supporting the substrates, and a reaction chamber that includes a reaction space for depositing material on the surface of the substrates during a processing phase. The substrate holders are installed or arranged to be installed inside the reaction chamber for processing of the substrates inside the reaction chamber during the processing phase. During a loading phase in which the substrates are loaded to the substrate holders by a loading device, at least some of the substrate holders are arranged to be movable relative to each other.

18 Claims, 5 Drawing Sheets

(51) Int. Cl.
*H01L 21/677* (2006.01)
*C23C 16/455* (2006.01)
*H01L 21/687* (2006.01)

(52) U.S. Cl.
CPC .. *H01L 21/67346* (2013.01); *H01L 21/67745* (2013.01); *H01L 21/67748* (2013.01); *H01L 21/68742* (2013.01); *H01L 21/68771* (2013.01)

(58) Field of Classification Search
CPC ......... H01L 21/67748; H01L 21/67745; H01L 21/68771; H01L 21/68742
See application file for complete search history.

(56) References Cited

U.S. PATENT DOCUMENTS

| | | |
|---|---|---|
| 2006/0196418 A1 | 9/2006 | Lindfors et al. |
| 2007/0032045 A1* | 2/2007 | Kasahara ............ C23C 16/4401 438/478 |
| 2008/0226842 A1 | 9/2008 | Vukovic |
| 2008/0264343 A1* | 10/2008 | Hagihara .......... H01L 21/67098 118/728 |
| 2009/0053906 A1 | 2/2009 | Miya et al. |
| 2012/0325145 A1* | 12/2012 | Satoyoshi ......... C23C 16/45546 118/666 |

FOREIGN PATENT DOCUMENTS

| | | |
|---|---|---|
| JP | 2000311862 A * | 11/2000 |
| JP | 2006303512 A * | 11/2006 |
| WO | 2009144371 A1 | 12/2009 |

OTHER PUBLICATIONS

International Search Report and Written Opinion of the International Searching Authority issued in PCT/FI2014/050151 dated Jun. 19, 2014.

* cited by examiner

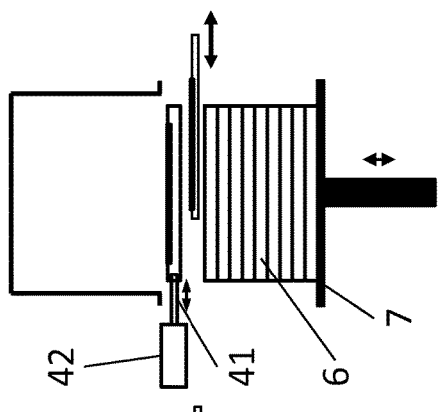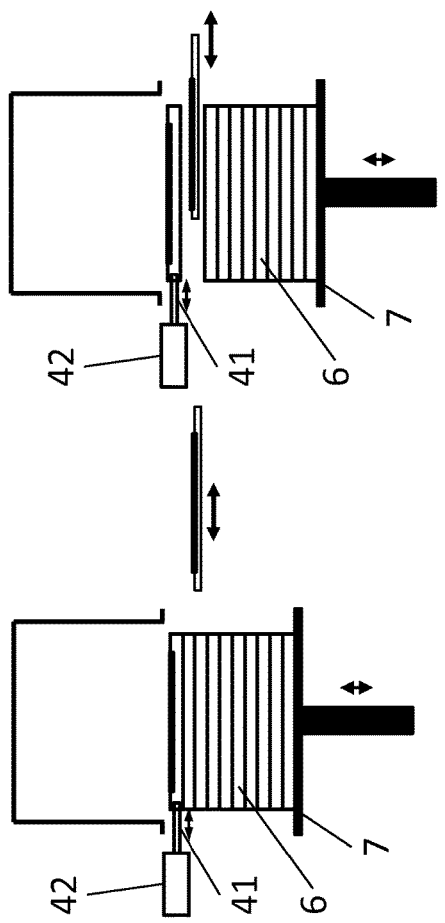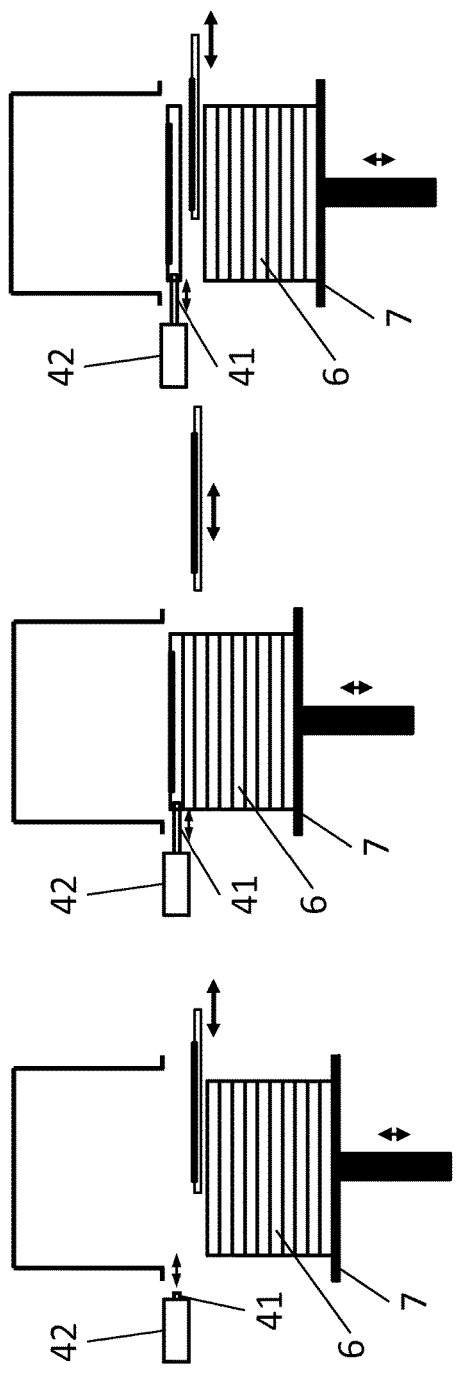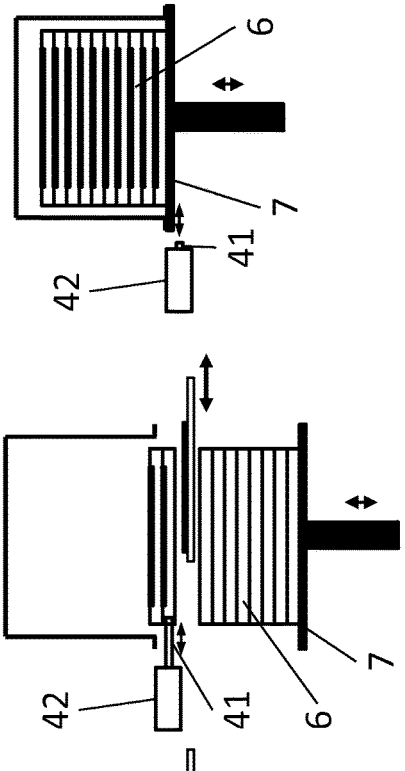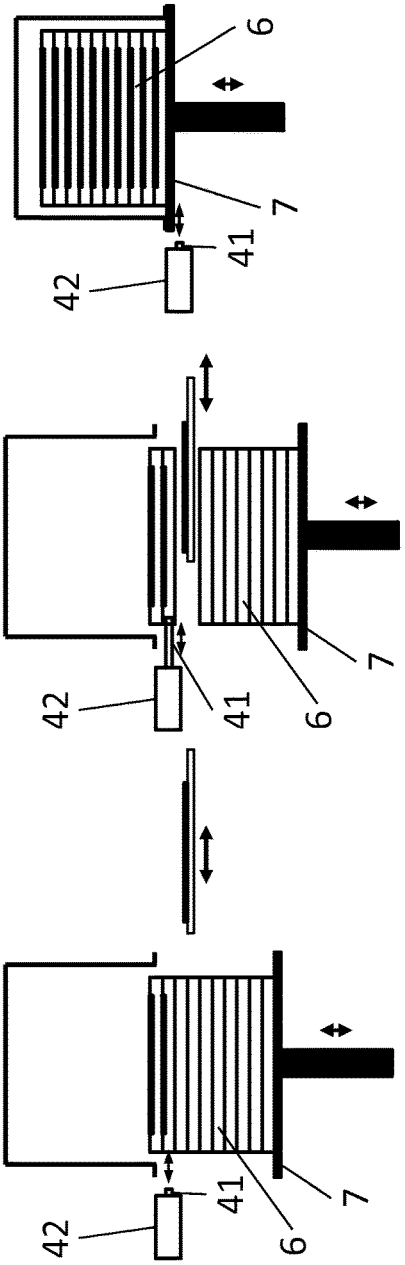

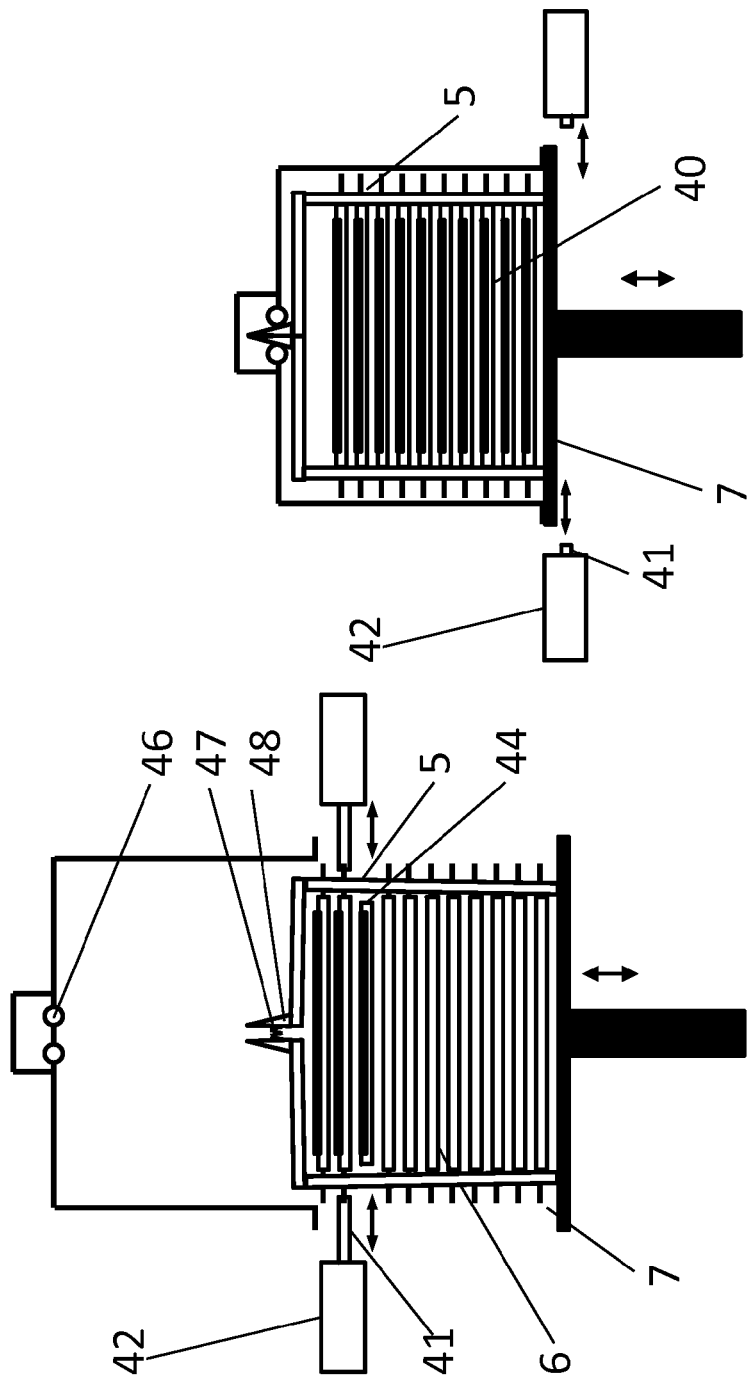

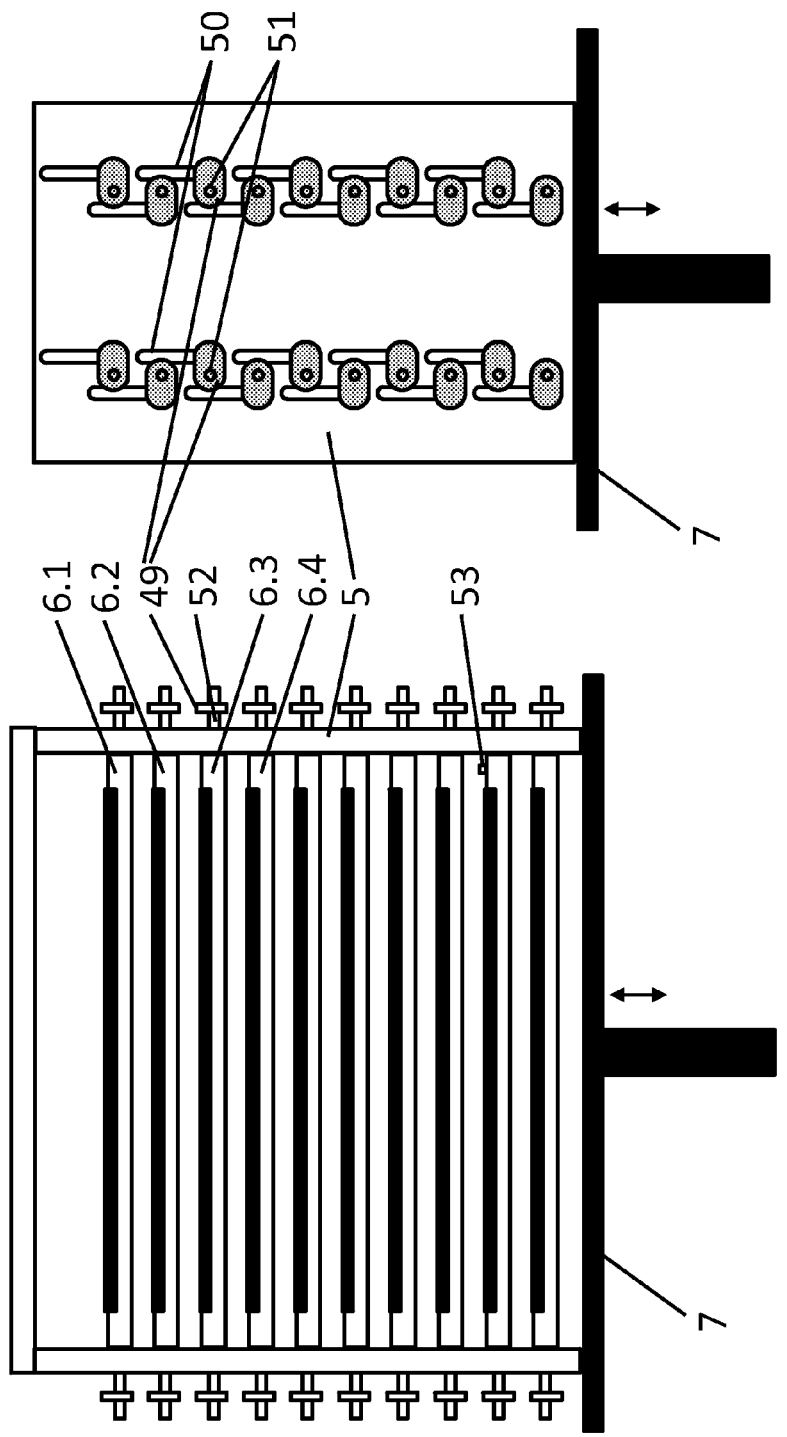

APPARATUS FOR PROCESSING TWO OR MORE SUBSTRATES IN A BATCH PROCESS

CROSS REFERENCE TO RELATED APPLICATIONS

The present application is a national stage of PCT/FI2014/050151, filed on Feb. 28, 2014 and published as WO 2014/147290, which claims priority to Finish Patent Application No. 20135280, filed on Mar. 22, 2013.

FIELD OF THE INVENTION

The present invention relates to an apparatus for processing two or more substrates in a batch process, and more particularly to an apparatus as defined in the preamble of independent claim 1.

BACKGROUND OF THE INVENTION

The present invention relates to an apparatus for processing substrates by subjecting at least part of the surface of the substrate to alternating surface reactions of two or more precursor materials. More particularly the present invention relates to an apparatus for processing substrates according to the principles of atomic layer deposition (ALD). In this application the term ALD means atomic layer epitaxy (ALE) and other similarly named methods realizing the principles of ALD. The atomic layer deposition apparatuses typically comprise a vacuum chamber inside which the substrates are processed. A separate reaction chamber may also be arranged inside the vacuum chamber such that the substrates are loaded into the reaction chamber and processed in the reaction chamber. The loading of the substrates may be carried out manually or by a loading device such as a loading robot. Conventionally the loading of the substrates into the ALD apparatus is carried out in normal ambient atmosphere, room atmosphere or atmosphere of a clean room. The present invention relates to the loading of the substrates into substrate holders for supporting said substrates.

WO 2009/144371 discloses an apparatus in which material is deposited on surfaces of a batch of vertically placed substrates in a reaction chamber. In the publication a batch of vertically placed substrates comprises a set of wafers placed in parallel into a movable substrate holder. The substrate holder is attached to a movable reaction chamber lid and the reaction chamber size is specially optimized for the size of the batch of vertically placed substrates or for the size of a substrate holder carrying the substrates. WO 2009/144371 discloses further that the spacing between the substrates is small for improving the efficiency of the reaction space but large enough to enable precursor flow to enter in between the substrates. The publication does not disclose how the substrates are loaded to the batch but because of the small spacing between the substrates in the batch increases requirements of the loading phase.

The common way to build a batch reactor is to use fixed shelves for the substrates as is used in the disclosure of the WO 2009/144371. One of the problems associated with the above mentioned prior art apparatus is that the loading device, for example an end-effector of a robot arm, must be very small because of the limited access. In order to get the substrates loaded to the substrate holder there needs to be space for the loading device to access between the shelves and to place the substrate there. The heavier the substrate is the more space is needed for the loading device to place the substrate to the shelf. At the same time cross section area becomes bigger resulting in a need for higher flows and correspondingly more piping and pumps. Another way to build a batch reactor is to arrange shelves such that the distance between following shelves is longer but this leads to other problems such as to more extensive precursor consumption, slower flushing and more extensive consumption of flushing gases and in conclusion to larger ALD apparatus. Some problems with the film quality may also arise when space between substrates becomes big. Problems may also arise with delivering enough precursors in conventional ways. When the size of the apparatus becomes larger there are also problems with transportation because of the height of the equipment.

SUMMARY OF THE INVENTION

An object of the present invention is to provide an apparatus so as to overcome or at least alleviate the prior art disadvantages. The objects of the invention are achieved by an apparatus which is characterized by what is stated in the independent claim. The preferred embodiments of the invention are disclosed in the dependent claims.

The invention is based on the idea of providing an apparatus for processing substrates such that during the loading phase in which the substrates are loaded to the substrate holders by a loading device at least some of the substrate holders are arranged to be movable relative to each other. This can be achieved by arranging the substrate holders such that the substrate holder being loaded has more space to the substrate holder above it than the space between same substrate holders during the processing phase so that the loading device can place the substrate to the substrate holder during the loading phase. During the loading phase when one substrate holder is loaded the other substrate holders are preferably in a waiting position being close to each other or if the substrate holder or holders are already loaded they are preferably in a processing position in which they are during the processing phase. So the apparatus according to the invention is for processing two or more substrates in a batch process by subjecting at least part of the surface of the substrates to alternating surface reactions of at least a first and a second precursor, the apparatus comprising: multiple substrate holders for supporting said substrates, and a reaction chamber comprising a reaction space, the reaction chamber configured for depositing material on the surface of the substrates in the reaction space during a processing phase, the substrate holders being installed or arranged to be installed inside the reaction chamber for processing the substrates inside the reaction chamber during the processing phase. During a loading phase in which the substrates are loaded to the substrate holders by a loading device at least some of the substrate holders are arranged to be movable relative to each other. In one embodiment of the invention the substrate holders are arranged in a substrate rack for holding a substrate batch comprising two or more substrates. In another embodiment of the invention the substrate holders are arranged in a pile.

An apparatus according to the invention for processing two or more substrates in a batch process by subjecting at least part of the surface of the substrates to alternating surface reactions of at least a first and a second precursor comprises multiple substrate holders for supporting said substrates. The apparatus further comprises a reaction chamber comprising a reaction space, which the reaction chamber is configured for depositing material on the surface of the substrates in the reaction space during a processing phase. The substrate holders are installed or arranged to be installed inside the reaction chamber for processing the substrates inside the reaction chamber during the processing phase. The apparatus further comprises an actuator enabling a relative movement of one or more substrate holders in relation to each other. The actuator enables a relative movement of one or more substrate holders such that during a loading phase in which the substrates are loaded to the substrate holders by a loading device the substrate holder being loaded and having another substrate holder above it is arranged in a loading position in which the distance from the substrate holder being loaded to the substrate holder above it is bigger than the distance between the same substrate holders during the processing phase. So the apparatus further comprising an actuator for moving the substrate holders such that during the loading phase the substrate holder being loaded and having another substrate holder above it is arranged in a loading position in which the distance from the substrate holder being loaded to the substrate holder above it is bigger than the distance between the same substrate holders during the processing phase. During the loading phase substrate holders other than the substrate holder being loaded are arranged to be moved by the actuator and/or a lifting means to a waiting position in which the substrate holders are closer to each other than in a processing position in which they are during the processing phase. During the loading phase substrate holders that are already loaded with the substrate are arranged to be moved by the actuator and/or a lifting means to a processing position such that the distance between consecutive loaded substrate holders is the same as during the processing phase. During the loading phase the substrate holder being loaded is moved to the loading position by the actuator and/or a lifting means. During the loading phase substrate holders other than the substrate holder being loaded are kept in place while the substrate holder being loaded is moved to the loading position by the actuator. The substrate holder can be a shelf for supporting the substrate and/or a pair of support flanges for supporting the substrate between said pair of support flanges. The substrate rack preferably comprises a bottom plate and frames, said substrate holders being arranged in connection to said frames. The actuator preferably comprises a pin arrangement arranged through the bottom plate and/or a rod arrangement through the reaction chamber. The apparatus further comprising a lifting means configured for lifting the loaded substrate rack into the reaction chamber such that the reaction chamber is arranged to be closed and opened by moving the substrate rack with the lifting arrangement. The actuator is arranged such that during the processing phase the moving parts of the actuator are arranged outside of the reaction chamber. The apparatus may further comprise a vacuum chamber.

An advantage of the apparatus of the invention is that the loading device is arranged to have enough space when loading the substrates to the batch during the loading phase and during the processing phase the distance between subsequent substrates is optimum for depositing the material on the surface of the substrates while the size of the reaction chamber can be kept such that there is no extra space that is not needed. Another advantage of the apparatus is that the apparatuses can be made more compact so that the apparatuses are smaller in size.

BRIEF DESCRIPTION OF THE DRAWINGS

In the following the invention will be described in greater detail by means of preferred embodiments with reference to the attached drawings, in which
FIGS. 2a-2f show one embodiment of the invention;
FIGS. 4a and 4b show the apparatus according to the invention;
and
FIGS. 5a and 5b show the embodiment shown in FIGS. 3a-3f from another view.

DETAILED DESCRIPTION OF THE INVENTION

Figure 1:
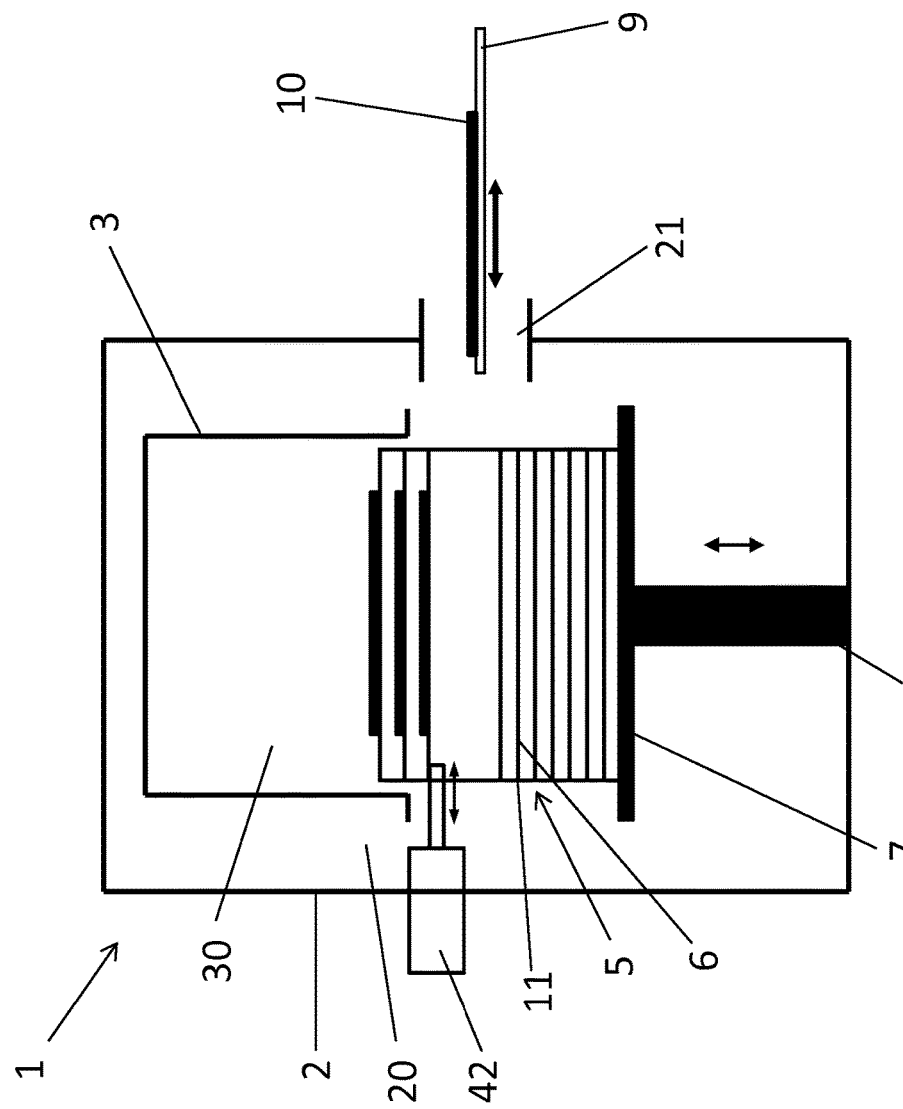
FIG. 1 shows an apparatus according to the invention.

FIG. 1 shows an apparatus according to the invention which the apparatus comprises an ALD unit 1 having a vacuum chamber 2 arranged to be substantially isolated from the ambient atmosphere. The vacuum chamber 2 may be at least partly opened and closed for isolating the inside space of the vacuum chamber 2 from the ambient atmosphere. The substrates may be arranged or loaded inside the vacuum chamber 2 for processing according to the principles of ALD. In this context ambient atmosphere means normal room atmosphere, clean room atmosphere or any atmosphere which is not suitable for providing an inert atmosphere against contamination or deterioration of the sensitive substrates. The ALD unit 1 furthermore comprises at least one vacuum device (not shown in the figure) operatively connected to the vacuum chamber 2 for providing vacuum inside the vacuum chamber 2. The vacuum device may be a vacuum pump or the like device. The vacuum device may be arranged to provide a vacuum pressure in the order of 0.1 mbar to 100 mbar, typically about 4 mbar. The vacuum device may be used to provide the mentioned vacuum pressure to the vacuum chamber 2 for the time the substrates are processed and the vacuum chamber 2 is closed. It should be noted that the vacuum chamber 2 may itself form the reaction chamber 3 in which the substrates are processed with the precursors or alternatively a separate reaction chamber 3 may be arranged inside the vacuum chamber 2, as shown in this figure. When a separate reaction chamber 3 is provided, the substrates are processed inside the reaction chamber 3 and the precursors are also fed into the separate reaction chamber 3.

The ALD unit 1 further comprises a precursor delivery system (not shown in the figure) for feeding gaseous precursors to the reaction chamber 3, meaning the vacuum chamber 2 or a separate reaction chamber 3 inside the vacuum chamber 2 as is in this example, so as to carry out atomic layer deposition. The precursor delivery system comprises one or more precursor sources, such as a gas container or a crucible, as well as pipes or ducts for leading the precursors to the reaction chamber 3. In other words, the precursors are fed to a reaction chamber 3 in a gaseous state, but in a precursor tank they may be as a gas, liquid, or solid. The precursor delivery system may also comprise exhaust means for removing precursors or flushing gases from the reaction chamber 3.

The ALD unit 1 comprises the vacuum chamber 2 defining a vacuum space 20. The vacuum chamber 2 is provided with a gate valve 21 through which the substrates 10 may be loaded inside the vacuum chamber 2. The gate valve 21 may also be replaced with loading hatch or the like. The ALD unit 1 comprises also a separate reaction chamber 3 arranged inside the vacuum chamber 2, the reaction chamber 3 defining a reaction space 30 inside the reaction chamber 3. The ALD unit 1 is also provided with a substrate rack 5 comprising several substrate holders 6 on which the substrates 10 are loaded. The substrate rack 5 comprises a bottom plate 7 on which the substrate rack 5 is supported.

The substrate rack 5 may also comprise a rack frame 11 and said substrate holders 6 are arranged in connection to said frame 11. The substrate rack 5 is further provided with a lifting means 8 arranged to the substrate rack 5 for lifting the substrate rack 5 inside the reaction chamber 3. In an open position of the reaction chamber 3 the substrate rack 5 is at least partly outside of the reaction chamber 3. A loading device is arranged to load substrates 10 with a loading arm 9 or the like through the gate valve 21 into the vacuum chamber 2 and to the substrate holders 6 of the substrate rack 5. The loading device is typically a loading robot having a robot arm 9 for loading, unloading and handling of the substrates 10. In the embodiment of FIG. 1 the loading is carried out in a substantially horizontal direction. During loading of the substrates 10 the lifting means 8 may move the substrate rack 5 stepwise to subsequent loading positions such that the loading movement of the loading device and the loading arm 9 may always be linear and substantially identical every time. Thus the lifting means 8 may move the substrate rack 5 stepwise linearly upwards and the loading device may load substrates 10 to the superposed substrate holders 6 of the substrate rack 5 with same substantially linear loading movement. This makes the loading of the substrates 10 simple and efficient and a batch of two or more substrates 10 may be provided to the substrate rack 5 without complicated loading movements. So the apparatus further comprises a lifting means configured for lifting the loaded substrate rack 5 into the reaction chamber 3 such that the reaction chamber 3 is arranged to be closed and opened by moving the substrate rack 5 with the lifting means. In FIG. 1 a substrate 10 is loaded to the top substrate holder 6 of the substrate rack 5. The top substrate holder 6 is not necessarily used in all embodiments of the invention for carrying the substrate 10 but the top substrate holder 6 may act like a top surface of the substrate rack 5 without carrying a substrate 10. When a substrate 10 is loaded to the top substrate holder 6 other substrate holders may stay in place because no extra space is needed for the loading. In this solution one or more actuators 42 are attached to the wall of the vacuum chamber 2. The actuator 42 can also be attached in another suitable position. The actuator 42 can be for example pneumatically or electrically operated.

FIGS. 2a-2f show an ALD apparatus 1 but the vacuum chamber 2 is left out for simplifying the figures. In these figures substrate holders 6 are piled upon each other, said substrate holders can be frames, shelves or alike with openings allowing precursor gases to flow over the substrate 10 surfaces. In FIG. 2a the reaction chamber 3 is open and all empty substrate holders are on top of each other. The first substrate 10 is loaded on the top holder 6. A shaft 41 of the actuator 42 is withdrawn. There are many ways to combine the number of actuators and their placing. One solution is to use four actuators, two on each of two opposite sides. FIG. 2b shows that after the first substrate 6 is loaded on the top substrate holder 6 the bottom plate 7 is moved upwards until the top substrate holder 6 is at the height of the actuator shaft 41. The actuator shaft 41 is moved outwards until the shaft end is in the corresponding hole/groove of the substrate holder 6. FIG. 2c shows another substrate 10 being loaded to the substrate holder 6. The bottom plate 7 is moved downwards taking all but the top substrate holder 6 with it. The top holder 6 is held in place by the actuator shafts 41. Thus a space is now available between the top holder and the rest of the holders, enabling the loading of the next substrate 10. FIG. 2d shows that the bottom plate 7 is moved upwards until the second holder from top reaches the top holder. The actuator shafts 41 are then withdrawn and the bottom plate 7 is moved further up for a distance of one more holder. FIG. 2e shows that the actuator shafts 41 are moved outwards into the corresponding holes/grooves of the holder 6. Then the bottom plate 7 is moved downwards opening a space between the two top holders 6 and the rest of the holders 6, thus enabling the loading of the next substrate 10. FIG. 2f shows that when all substrates 10 are loaded and all actuator shafts 41 are withdrawn the bottom plate 7 is moved upwards until the reaction chamber 3 is closed.

There is another way to load the substrates 10 to the substrate holders 6 as explained now. In this embodiment the top substrate holder 6 already comprises a substrate 10 so the substrate holder to be loaded is then having another substrate holder 6 above it. The substrate holder 6 being loaded is arranged in a loading position such that the distance from it to the substrate holder 6 above it is bigger than the distance between said substrate holders 6 during processing phase. In this embodiment the loading device 9 keeps the same position in a vertical direction during all the loading phase so that in order to get the substrate holder 6 being loaded in a right position means that the lifting means 8 has to lift the substrate holder 6 upwards. The space between the substrate holder 6 being loaded and the substrate holder 6 above it is arranged by moving the substrate holder 6 being loaded and/or by moving other substrate holders 6 and in this particular case the substrate holder 6 above it is the top most substrate holder which in this case cannot be moved further away from the substrate holder 6 being loaded so that the substrate holder 6 being loaded must be moved away from the top most substrate holder 6 and preferably other substrate holders 6 below it are also moved closer to each other. So during the loading phase substrate holders 6 other than the substrate holder 6 being loaded are arranged to be moved by the actuator to a waiting position in which the substrate holders 6 are closer to each other than in a processing position in which they are during the processing phase. In another embodiment of the invention the loading device 9 is arranged to be moved inside the vacuum 2 and/or reaction chamber 3 in a certain height and then moved downwards for example about 10-20 mm or even about 200-300 mm so that the substrate 10 is arranged to the substrate holder 6 and the loading device 9 is separated from the substrate 10. The loading device 9 is then moved outside from the vacuum 2 and/or reaction chamber 3 in this lower position or moved upwards inside the vacuum 2 and/or reaction chamber 3 and then moved outside. When the two upper substrate holders 6 are already loaded and arranged in a processing position in which they are during the processing phase the substrate holder 6 being loaded is preferably moved away from the substrate holder 6 above it and the other substrate holders 6 below it are arranged in a waiting position such that they are closer to each other than during the processing phase having a processing position. The substrate holder 6 being loaded is preferably moved by the actuator such that while the two upper substrate holders 6 are in a processing position the substrate holder 6 being loaded is moved away from them and the substrate holders 6 below the one being loaded are arranged in a waiting position such that the space between consecutive substrate holders 6 is smaller than the space between same substrate holders 6 during the processing phase. So during the loading phase substrate holders 6 that are already loaded with the substrate 10 are arranged to be moved by the actuator to a processing position such that the distance between consecutive loaded substrate holders 6 is the same as during the processing phase. It can also be possible that during the loading phase substrate holders 6 other than the substrate holder 6 being loaded are kept in place while the substrate holder 6 being loaded is moved to the loading position by the actuator. During the loading phase the substrate holder 6 being loaded is moved to the loading position by the actuator. The actuator moving said substrate holders 6 is preferably a pin arrangement such that pins are arranged through the reaction 3 and/or vacuum chamber 2 bottom which in case of FIG. 3 is the reaction chamber 3 bottom. Said reaction chamber 3 bottom is preferably arranged by a bottom plate 7 of a substrate rack 5 so the pin arrangement is arranged through the bottom plate 7 as well. Other actuator arrangements are also possible such as arranging rods through the chamber wall. The actuator can also be arranged such that the moving parts are outside of the reaction chamber 3. So there is no contamination or film deposition on the moving parts and therefore no particle generation.

Figure 3A:
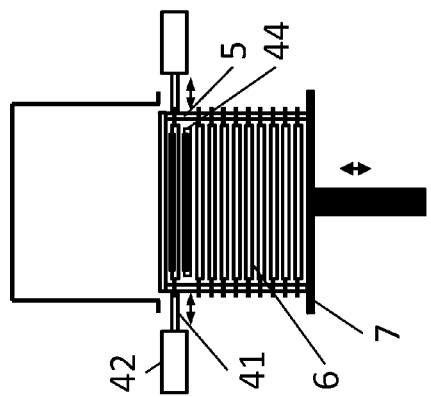
FIGS. 3a-3f show another embodiment of the invention.
Figure 3B:
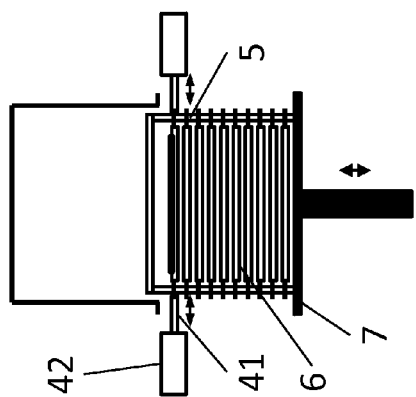
Figure 3C:
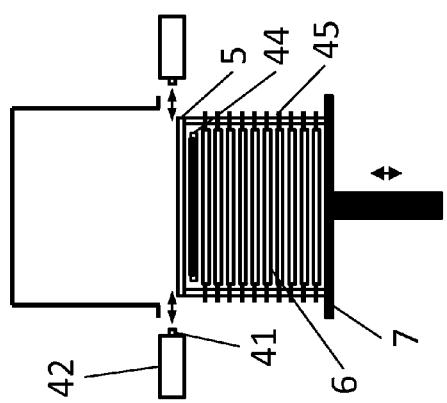
Figure 3D:
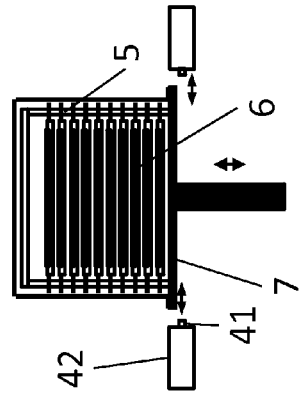
Figure 3E:
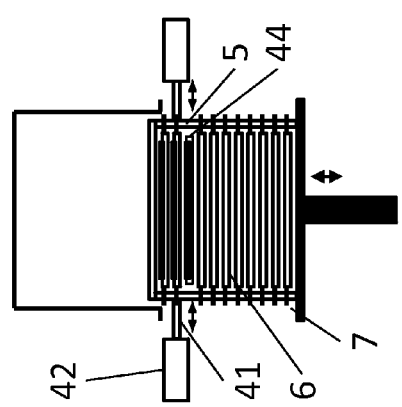
Figure 3F:
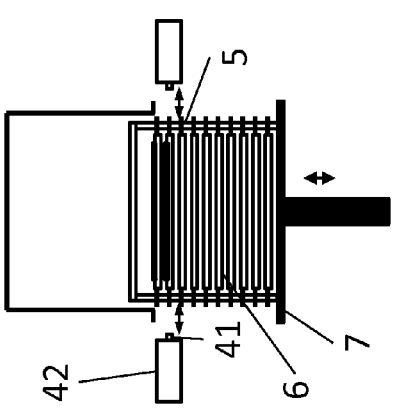

FIGS. 3a-3f show a solution with substrate holders 6 separately supported within a substrate rack 5. The substrate holders can be frames, shelves or alike with space between each other allowing the precursor gases to flow over the substrate surfaces. FIG. 3a shows the reaction chamber 2 in an open position and all empty substrate holders 6 are supported by the rack 5 by means of the holder pins 45. The first substrate is loaded on the top holder. The shafts 41 of actuators 42 are withdrawn. There are many ways to combine the number of actuators and their placing. One solution is to use four actuators, two on each of two opposite sides. FIG. 3b shows that the bottom plate 7 is moved upwards until the top substrate holder 6 is at the height of the actuator shaft 41. The actuator shafts 41 are moved outwards until the shaft ends are connected to the holder pins. The end effector 44 of the loading device is retracted. FIG. 3c show that the bottom plate 7 is moved downwards taking all but the top substrate holder 6 with it. The top holder 6 is held in place by the actuator shafts 41. Thus a space is now available between the top holder 6 and the next holder 6, enabling the loading of the next substrate 10. FIG. 3d shows that the bottom plate 7 is moved upwards until the top holder 6 lays on its pins. The actuator shafts 41 are then withdrawn and the bottom plate 7 is moved further up for a distance of one more holder. FIG. 3e shows that the actuator shafts 41 are moved outwards until the shaft ends are connected to the holder pins 45. Then the bottom plate 7 is moved downwards opening a space between the two top holders 6 and the rest of the holders 6, thus enabling the loading of the next substrate. FIG. 3f shows the end situation in which all substrates 10 are loaded and all actuator shafts 41 are withdrawn and the bottom plate 7 is moved upwards until the reaction chamber 3 is closed.

FIGS. 4a and 4b show an embodiment of the invention in which the substrate rack 5 is held open by a spring 47 during loading of the substrates. In this embodiment the rack 5 sides are slightly inclined allowing the substrate holders 6 to be moved vertically. When all substrates have been loaded the reaction chamber 3 is closed by moving the bottom plate 7 upwards. When the rack wedges 48 reaches the rolls 46 the rack is forced to close. This solution can be used e.g. when a good heat conductance between the rack sides and the substrate holders is needed or if there is a need to close/seal the holder pin openings in the rack sides.

FIGS. 5a and 5b show the embodiment in which the substrate holders 6 are separately supported within a rack 5 as shown earlier in FIGS. 3a-3f. So the FIGS. 5a and 5b show one embodiment of a rack assembly where the substrate holders 6 can be moved vertically in relation to the rack 5 walls, thus creating the space needed for loading the substrates 10. If the actuator shafts 41 are connected to the pins 51 and the bottom plate 7 is lowered, the actuators will keep the substrate holder 6.3 in place while the rest of the rack moves downwards. This way the space between this substrate holder and the holder 6.4 below is increasing at the same time as the space to the holder 6.2 above is decreasing. The relative movement is made possible by slots 50 where pin shafts 55 can move in relation to the rack wall. When the bottom plate 7 is moved further down the spacers 49 will reach the spacers of the holder 6.2 above, stopping the further movement of holder 6.2. When the bottom place 7 continues to move downwards the space between holders 6.3 and 6.4 will continue to increase while the space between holders 6.2 and 6.1 starts to decrease. The spacers 49 can be realized in many different ways, one being adding the spacers as a part of the substrate holder, part 53 in the figure above.

FIG. 5a shows a fully loaded substrate rack 5 in a processing position. The placing of substrates 10 in the substrate rack 5 is arranged by placing them in a horizontal position so that the surface of each substrate is in a horizontal plane. The substrates 10 are preferably placed in consecutive substrate holders 6 such that they form a batch of horizontally placed substrates 10. When the substrate rack 5 is fully loaded with substrates 10 the lifting means moves the substrate rack 5 such that the substrate rack 5 is completely inside the reaction chamber 3. The substrate rack 5 is arranged to close the reaction chamber 3 when it is fully inside the reaction chamber 3. In this embodiment the bottom plate 7 of the substrate rack 5 is arranged to be placed against a flange of an open wall of the reaction chamber 3 for closing the reaction space 30. Therefore the substrate rack 5, in this embodiment the bottom plate 7, is arranged to form at least part of the reaction chamber 3 when the reaction chamber 3 is closed. Furthermore, the reaction chamber 3 is arranged to be closed and opened by moving the substrate rack 5 with the lifting means. Therefore, the present invention enables combining the loading of the substrates 10 and closing the reaction chamber 3.

So the substrates may be loaded according to the invention in a substrate rack 5 comprising multiple substrate holders 5 or they may be loaded to a pile of substrate holders 5. The substrate holders 5 in both embodiments are for supporting said substrates and the substrate holders 5 are arranged to be movable relative to each other.

It will be obvious to a person skilled in the art that, as the technology advances, the inventive concept can be implemented in various ways. The invention and its embodiments are not limited to the examples described above but may vary within the scope of the claims.

The invention claimed is:

1. An apparatus for processing two or more substrates in a batch process by subjecting at least part of a surface of the substrates to alternating surface reactions of at least a first and a second precursor, the apparatus comprising:

a vacuum chamber defining a vacuum space, a reaction chamber arranged inside the vacuum chamber, the reaction chamber comprising a reaction space, the reaction chamber being configured for depositing material on the surface of the substrates in the reaction space during a processing phase, multiple substrate holders for supporting said substrates, wherein the substrate holders being installed or arranged to be installed inside the reaction chamber for processing of the substrates inside the reaction chamber during the processing phase the substrate holders are arranged on a substrate rack comprising a bottom plate and provided with a lifting means for lifting the substrate rack inside the reaction chamber, and an actuator enabling a relative movement of one or more substrate holders in relation to each other, wherein during a loading phase in which the substrates are loaded to the substrate holders by a loading device, at least some of the substrate holders are arranged to be vertically movable relative to each other while the substrate holders remain on the substrate rack such that the actuator is arranged to hold in place the substrate holders that are loaded and the lifting means is arranged to move the substrate holders that are unloaded away from the substrate holders that are loaded for providing space between the substrate holder being loaded and the substrate holder above it, or the actuator is arranged to move the substrate holders that are loaded away from the substrate holders that are unloaded, and the lifting means is arranged to hold in place the substrate holders that are unloaded or to move the substrate holders that are unloaded away from the substrate holders that are loaded for providing space between the substrate holder being loaded and the substrate holder above it, for enabling relative movement of the substrate holders.

2. The apparatus according to claim 1, wherein the substrate holders are arranged in a pile.

3. The apparatus according to claim 1, wherein during the loading phase the substrate holder being loaded and having another substrate holder above it is arranged in a loading position in which a distance from the substrate holder being loaded to the substrate holder above it is bigger than a distance between the same substrate holders during the processing phase.

4. The apparatus according to claim 3, wherein during the loading phase substrate holders other than the substrate holder being loaded are arranged to be moved by the actuator and/or the lifting means to a waiting position in which the substrate holders are closer to each other than in a processing position in which they are during the processing phase.

5. The apparatus according to claim 4, wherein the substrate rack is comprising frames, and the substrate holders being arranged in connection to said frames, and the substrate holders are arranged in connection to said frames, and the actuator comprises a pin arrangement arranged through the bottom plate.

6. The apparatus according to claim 3, wherein during the loading phase substrate holders that are already loaded with the substrate are arranged to be moved by the actuator and/or the lifting means to a processing position such that the distance between consecutive loaded substrate holders is the same as during the processing phase.

7. The apparatus according to claim 6, wherein the substrate rack is comprising frames, and the substrate holders being arranged in connection to said frames, and the substrate holders are arranged in connection to said frames, and the actuator comprises a pin arrangement arranged through the bottom plate.

8. The apparatus according to claim 3, wherein during the loading phase the substrate holder being loaded is moved to the loading position by the actuator and/or the lifting means.

9. The apparatus according to claim 8, wherein the substrate rack is comprising frames, and the substrate holders being arranged in connection to said frames, and the substrate holders are arranged in connection to said frames, and the actuator comprises a pin arrangement arranged through the bottom plate.

10. The apparatus according to claim 3, wherein, during the loading phase, substrate holders other than the substrate holder being loaded are kept in place while the actuator moves the substrate holder being loaded to the loading position.

11. The apparatus according to claim 10, wherein the substrate rack is comprising frames, and the substrate holders being arranged in connection to said frames, and the substrate holders are arranged in connection to said frames, and the actuator comprises a pin arrangement arranged through the bottom plate.

12. The apparatus according to claim 3, wherein the substrate rack comprising frames, and the substrate holders being arranged in connection to said frames, and the actuator comprises a pin arrangement arranged through the bottom plate.

13. The apparatus according to claim 3, wherein the actuator comprises a rod arrangement through the reaction chamber.

14. The apparatus according to claim 3, wherein the actuator is arranged such that during the processing phase moving parts of the actuator are arranged outside of the reaction chamber.

15. The apparatus according to claim 1, wherein the substrate holder is a shelf for supporting the substrate.

16. The apparatus according to claim 1, wherein the substrate holder is a pair of support flanges for supporting the substrate between said pair of support flanges.

17. The apparatus according to claim 1 wherein the substrate rack comprises frames, said substrate holders being arranged in connection to said frames.

18. The apparatus according to claim 1, wherein the lifting means is configured for lifting the loaded substrate rack into the reaction chamber such that the reaction chamber is arranged to be closed and opened by moving the substrate rack with the lifting means.

* * * * *